(12) United States Patent
Doll

(10) Patent No.: US 6,796,370 B1
(45) Date of Patent: Sep. 28, 2004

(54) SEMICONDUCTOR CIRCULAR AND RADIAL FLOW COOLER

(75) Inventor: Wade J. Doll, Sumner, WA (US)

(73) Assignee: Cray Inc., Seattle, WA (US)

( * ) Notice: Subject to any disclaimer, the term of this patent is extended or adjusted under 35 U.S.C. 154(b) by 0 days.

(21) Appl. No.: 09/705,367

(22) Filed: Nov. 3, 2000

(51) Int. Cl.$^7$ .................................................. H05K 7/20
(52) U.S. Cl. ..................... 165/80.4; 165/80.3; 165/168; 165/170; 257/714; 361/699
(58) Field of Search .............................. 165/80.3, 80.4, 165/125, 168, 170, 908; 257/714; 361/699

(56) References Cited

U.S. PATENT DOCUMENTS

| | | | | |
|---|---|---|---|---|
| 2,629,230 A | * | 2/1953 | Turner | 165/168 |
| 3,882,934 A | * | 5/1975 | Knoos et al. | 165/170 |
| 3,909,118 A | * | 9/1975 | Schmidt | 165/908 |
| 3,923,383 A | * | 12/1975 | Engel et al. | 165/170 |
| 4,260,015 A | * | 4/1981 | Tamburini | 165/170 |
| 4,411,311 A | * | 10/1983 | Touze | 165/170 |
| 4,450,896 A | * | 5/1984 | Opitz et al. | 165/80.4 |
| 4,489,570 A | * | 12/1984 | Little | 165/168 |
| 4,920,574 A | * | 4/1990 | Yamamoto et al. | 165/80.4 |
| 5,056,127 A | * | 10/1991 | Iversen et al. | 165/80.4 |
| 5,070,936 A | * | 12/1991 | Carroll et al. | 165/80.4 |
| 5,294,830 A | * | 3/1994 | Young et al. | 165/80.4 |
| 5,365,400 A | * | 11/1994 | Ashiwake et al. | 165/80.3 |
| 5,629,834 A | * | 5/1997 | Kodama et al. | 165/80.3 |
| 5,640,046 A | * | 6/1997 | Suzuki et al. | 257/714 |
| 6,015,008 A | * | 1/2000 | Kogure et al. | 165/80.3 |

FOREIGN PATENT DOCUMENTS

| | | | | |
|---|---|---|---|---|
| DE | 2508727 A1 | * | 9/1976 | 165/125 |
| JP | 07234035 A | * | 9/1995 | |

* cited by examiner

Primary Examiner—Leonard R. Leo
(74) Attorney, Agent, or Firm—Seed IP Law Group PLLC

(57) ABSTRACT

A heat exchanger with a circular fluid chamber, configured to distribute cooling fluid flow from the center of the chamber to the periphery of the chamber. Fins are disposed within the chamber to direct the flow in a generally radial or spiral pattern. There is an annular recess with varying cross sectional area in the overhead wall of the chamber to equalize pressure drop from the center of the chamber to an outlet aperture from any initial radial flow path. The configuration of the exchanger imparts a rotational flow velocity to the fluid when it reaches the outer perimeter or annular wall of the chamber. The rotational flow reduces back pressure against the radial or spiral flow being directed to the periphery of the circular chamber. The inlet flow is introduced from the overhead wall and impinges on the center of the bottom plate of the chamber. The impact creates turbulence in the fluid which increases heat overall heat transfer coefficient of the exchanger. The exchanger is rotatably mounted in a clamp plate.

12 Claims, 7 Drawing Sheets

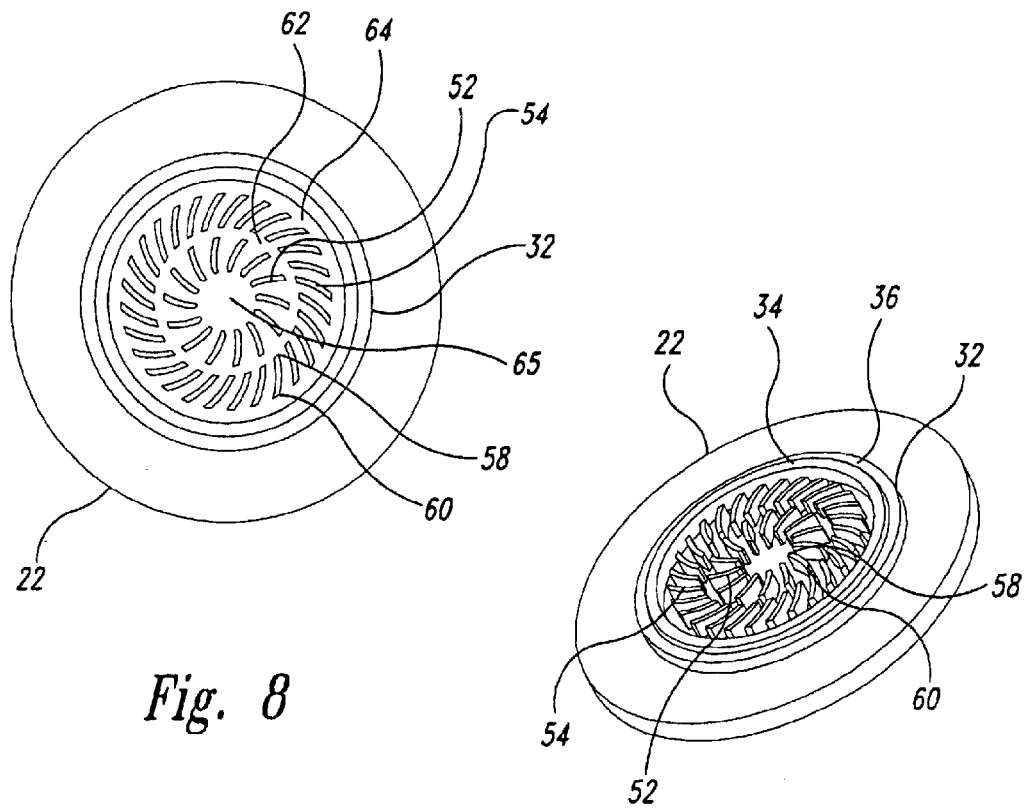
Fig. 8
Fig. 9
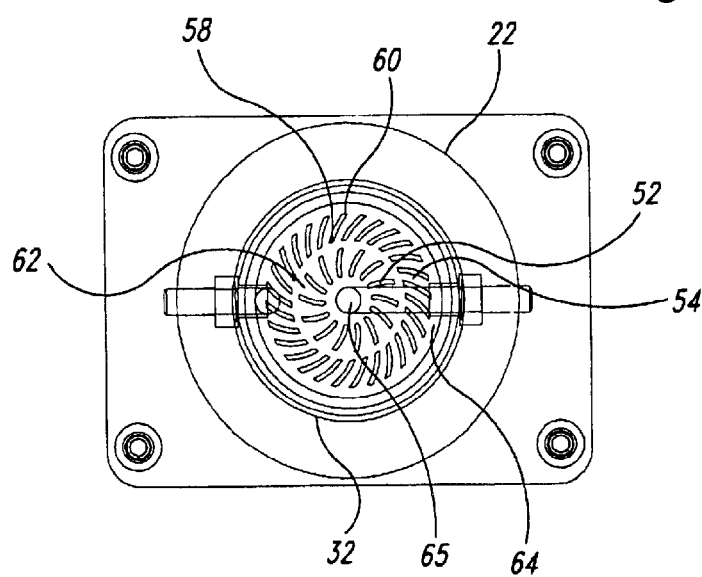
Fig. 10

SEMICONDUCTOR CIRCULAR AND RADIAL FLOW COOLER

TECHNICAL FIELD

The present invention relates to heat exchangers for semiconductor chips.

BACKGROUND OF THE INVENTION

The dissipation of thermal energy away from a semiconductor chip has been a matter of concern which has generated a significant quantity of art in the field. As circuits have become more highly integrated, the amount of thermal energy generated by the circuits has increased. Thermal energy in a semiconductor chip will elevate the temperature of the chip, which in turn, decreases performance and reliability.

The problem of thermal energy is compounded when the semiconductor chip is position in a dense arrangement of computer circuitry in a circuit board. With the circuit board being disposed in a supportive and protective enclosure, along with adjacent circuit boards, the overall effect is to concentrate thermal energy around the chip.

When high levels of thermal energy are anticipated, heat dissipation may be best achieved by use of a fluid cooled heat exchanger. The small dimensional scale on which this must occur, and within the tight confines of an arrangement of circuit boards, presents unique problems in the area of heat exchange. For example, elaborate systems of fluid distribution through such exchangers to increase heat transfer efficiency are not feasible, as contrasted with large scale heat exchangers, where spatial confines are not nearly as much of a problem. Furthermore, expense per unit must be kept to a minimum as the number of exchangers needed through the circuitry of some computer systems will be large. In addition, mechanical problems of installation arise. Fluid cooling can be performed using an air flow over a chip or a heat exchange on a chip. Many computers have small fans on the inside to provide a flow of air over the circuits and components to enhance cooling. If a liquid, such as water, is used as the cooling fluid, the design of the circuit board becomes more complicated because cooling water must be run to each of the exchangers. The tight confines within which this must occur necessitates heat exchanger design that allows easy access to the exchanger with a fluid source.

SUMMARY OF THE INVENTION

The present invention provides a apparatus for improving heat transfer efficiency in the area of heat exchange for semiconductor chips as well as improving accessibility to the to the heat exchanger for providing fluid to the exchanger.

A cylindrical conduit chamber has inlet and outlet fluid conduits. The cylindrical conduit chamber has a bottom surface that mates with an annular wall extending from a fin plate. The bottom surface of the conduit chamber, the annular wall, and the fin plate define a circular chamber through which fluid is passed and into which heat is drawn from a heat emitting source.

The cylindrical conduit chamber is mounted within a retaining assembly for releasably attaching the heat exchanger to a semiconductor chip package. The cylindrical conduit chamber is rotatable within the assembly. As such, when the assembly is disposed in a circuit board, tubing is easily run to an opening of the inlet conduit on the cylindrical conduit chamber, since it can be rotated to face the direction from which the tubing is run.

The fin plate has a plurality of fins which are arranged in two concentric circular arrays. The fins are arranged in a generally radial array and have the shape of a spiral pattern. Each fin in both the inner and outer arrays of fins, extends laterally from a leading edge to a trailing edge which is radially outward of the leading edge. Each fin is curved to provide a spiral pattern in the array. The spiral pattern of the fins results in the trailing edge being rotationally offset from the leading edge. The fins can be curved or straight but are curved in the preferred embodiment. In addition, between the inner and outer array of fins there is an annular space. Similarly, between the outer array of fins and the annular wall, there is a second annular space.

The bottom surface of the cylindrical conduit provides an overhead wall of the circular chamber. A fluid inlet aperture is positioned above the center of the fin plate. A fluid outlet aperture is also positioned on the overhead wall, but above a peripheral portion of the fin plate. An annular fluid channel is recessed upwardly into the overhead wall. The annular channel of the overhead wall is disposed over the second annular space. The annular channel has a varying cross section area that decreases from a position furthest the outlet aperture and becomes a minimum at a position adjacent the outlet aperture.

The structure of the heat exchanger described provides a preferred embodiment of an apparatus for carrying out the method of heat exchange introduced by the present invention.

The structure allows for impacting the fluid on a central portion of a plate within a circular chamber to create turbulence in the fluid which results in an improved heat transfer coefficient. From the center region of the fin plate, the fluid disperses generally radially throughout the fluid chamber, being guided by the fins in a spiraling direction. When the fluid reaches the annular wall, it has a rotational velocity. The rotational velocity of the fluid about the perimeter of the chamber reduces back pressure against the fluid flowing radially outward. This improves fluid distribution.

The varying cross sectional area of the recessed annular channel, has the effect of equaling pressure drop for a given flow rate of fluid, initiated in any radial direction from the central region of the plate, on through to the outlet aperture. The resulting improvement is that fluid flow is evenly distributed throughout the chamber, rather than coming to a steady state wherein pressure is equalized such that most of the fluid flow is straight from the inlet aperture to the outlet aperture without traversing any portion of the second annular space.

The fins are curved in the preferred embodiment which changes the momentum of the fluid with respect to the fins as it passes by the fins, and this in turn, reduces boundary layer thickness on the fins. The result is an improved individual heat transfer coefficient of the fluid. The curvature also serves to provide extra surface area for heat transfer.

There is an annular space between the inner array of fins and the outer array. The annular space breaks off boundary layer formation on the inner array of fins such that it is re-initiated again at the outer array. This serves to minimize boundary layer formation.

An advantage of the present invention is that it provides optimum fluid distribution through the fluid chamber of the exchanger with relative simplicity. Furthermore, it provides easy access for running a fluid line to the exchanger, without having to use varying amounts of line depending on how the exchanger is configured within the board.

BRIEF DESCRIPTION OF THE DRAWINGS

FIG. 8 is a plan view of the fin plate.

FIG. 9 is an isometric view of the fin plate.

FIG. 10 is an enlarged top partial cut-away view of the fin showing the inlet and outlet conduits as position in the turret head with respect to the fin plate.

DETAILED DESCRIPTION OF PREFERRED EMBODIMENTS

The present invention relates to a heat exchanger and assembly for a semiconductor chip. Specific details of certain embodiments of the invention are set forth in the following description and in FIGS. 1 through 11 to provide a thorough understanding of such embodiments. One skilled in the art, however, will understand that the present invention may have additional embodiments, or that the invention may be practiced without several of the details described in the following description.

Figure 1:
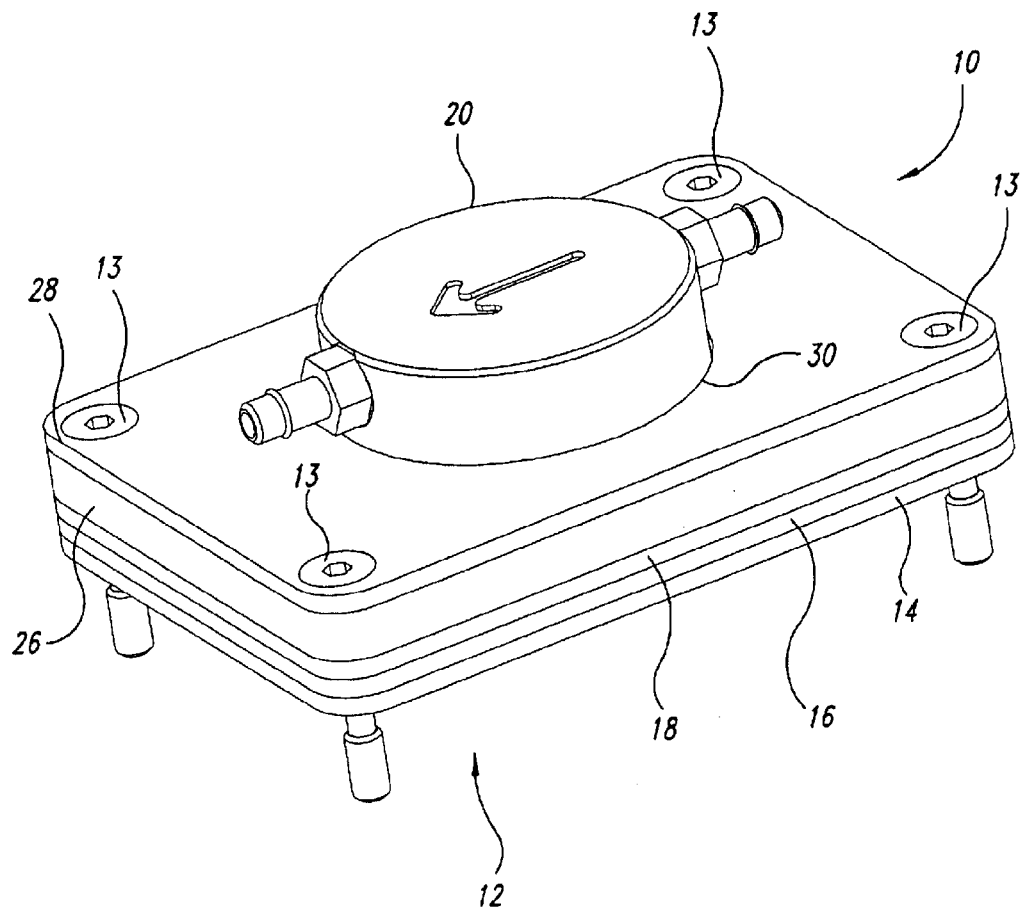
FIG. 1 is an isometric view of the heat exchanger disposed within the clamp plate and bow spring, with the clamp plate being attached to a semiconductor chip package.
Figure 2A:
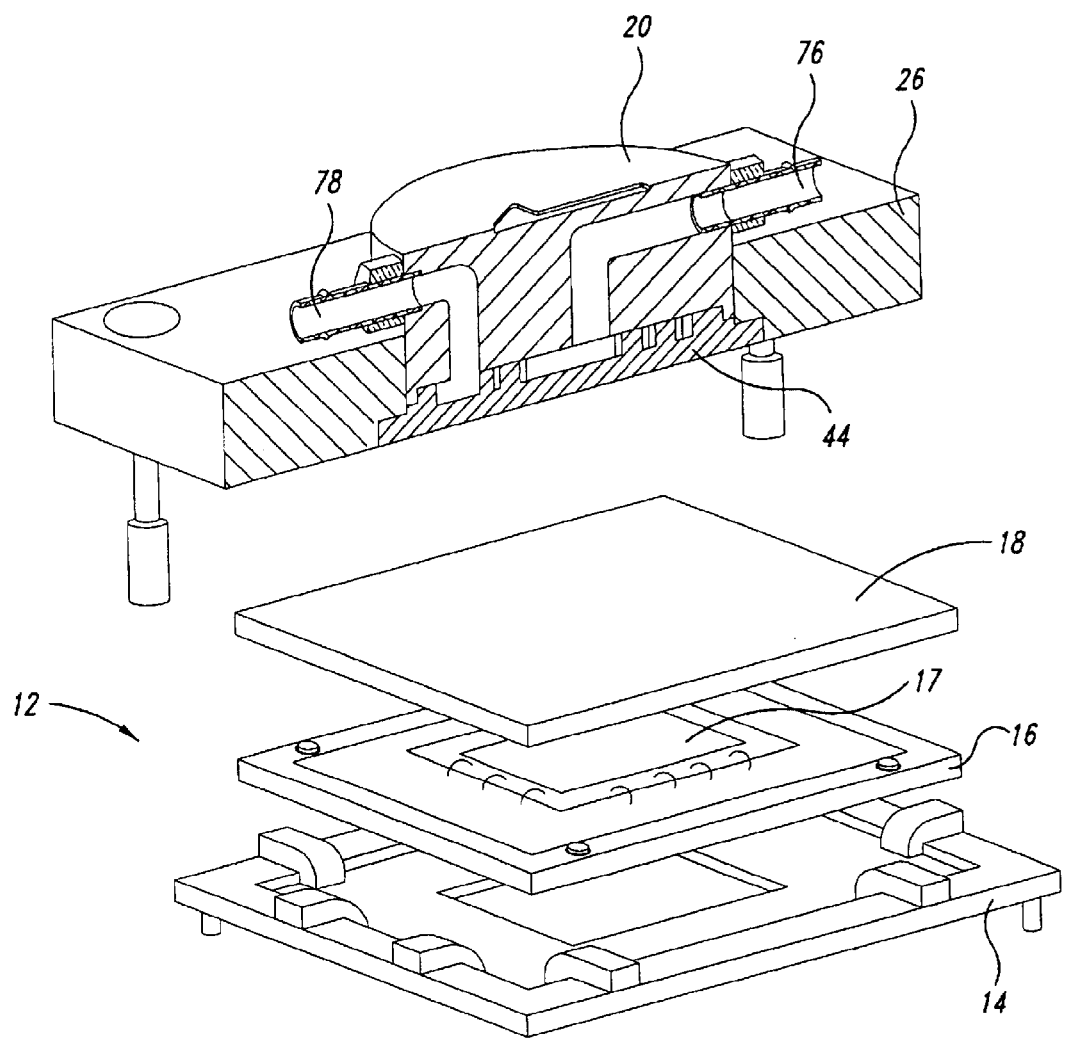
FIG. 2A is an exploded view of the structure of FIG. 1.

As best seen in FIGS. 1 and 2A, the heat exchanger assembly 10 is typically mounted atop a semiconductor package 12. The semiconductor package typically comprises a semiconductor chip 17, socket 14, and a substrate 16 within which the semiconductor chip is disposed, and a lid or heat spreader 18.

Figure 2B:
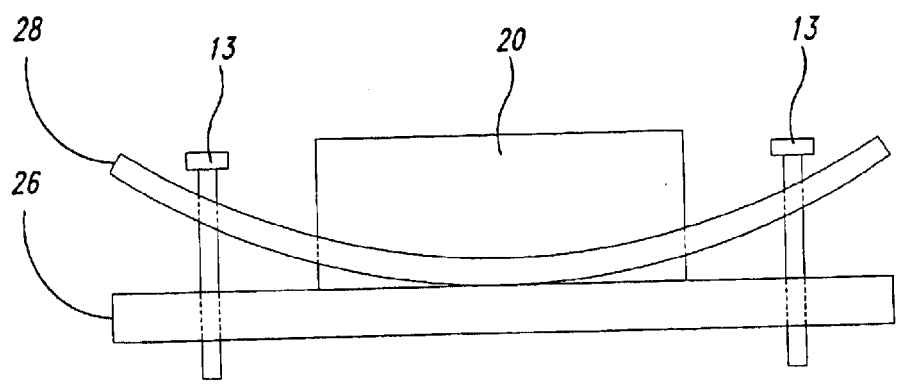
FIG. 2B is a side view of the heat exchanger assembly.
Figure 3:
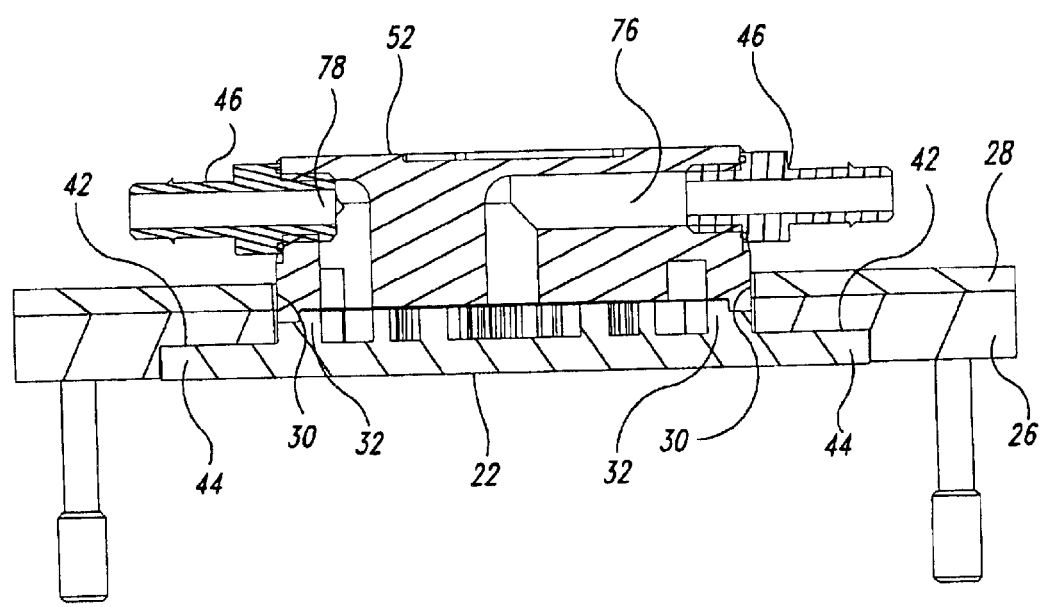
FIG. 3 is a cross-sectional view of the heat exchanger and clamp plate.
Figure 4:
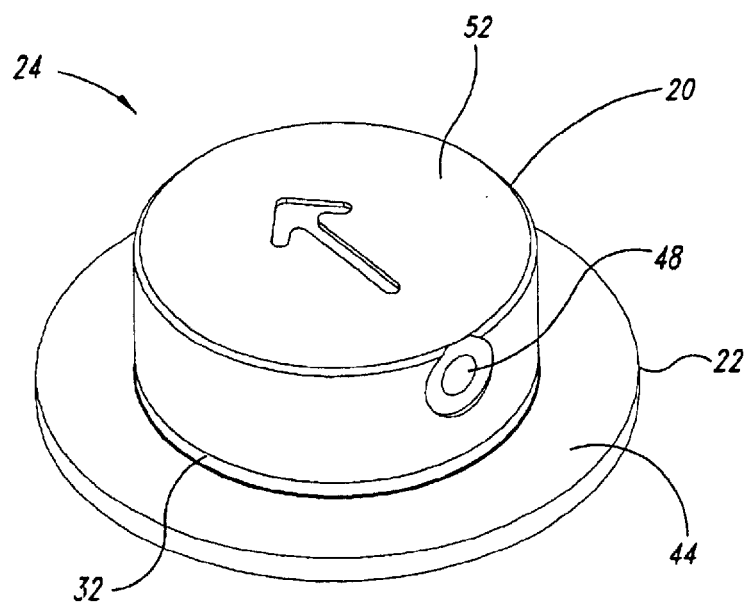
FIG. 4 is a front overhead view of the cylindrical turret head.
Figure 5:
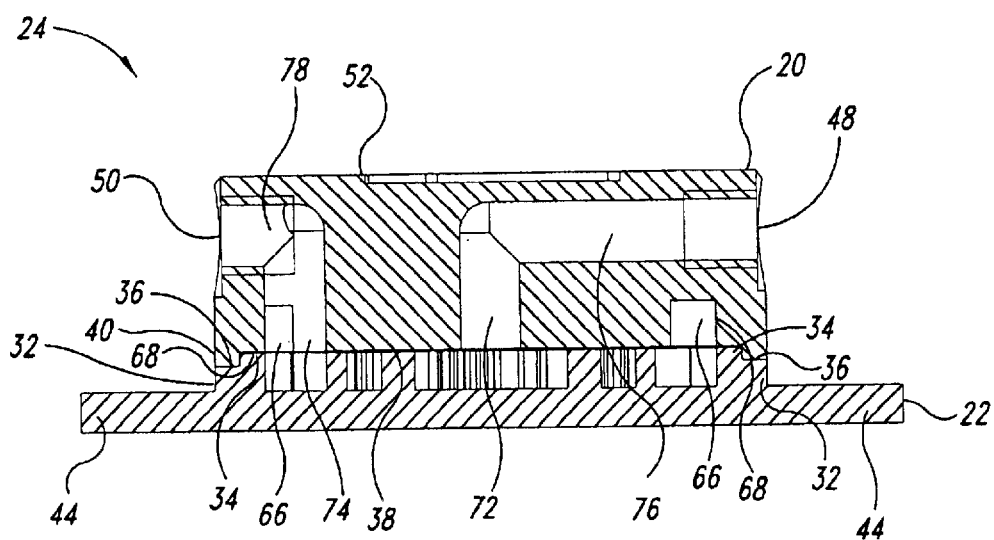
FIG. 5 is a cross-sectional view of the heat exchanger assembly, including the fin plate and the turret head.

As best seen in FIGS. 4 and 5, the heat exchanger 24 comprises a cylindrical conduit chamber 20 also referred to as turret head 20, and a circular bottom fin plate 22, fixedly connected to the turret head. The exchanger is mounted within a retaining assembly, or in the preferred embodiment, a clamp plate 26, and a bow spring 28, as seen in FIGS. 2A, 2B, and 3. The bow spring is positioned above the clamp plate, and both the clamp plate 26 and bow spring 28 have bores 30. The bores 30 are aligned so that the cylindrical 20 turret head fits through the aligned bores 30 and can be rotated as needed. In the preferred embodiment, there are flat head screws 13 at the corners of the clamp plate and bow spring to tighten the spring as well as attach the assembly to a packaged semiconductor chip. See FIGS. 2A and 2B.

Now referring to FIGS. 3, 4 and 5, the clamp plate 26 has a recessed annular area 42 surrounding the perimeter of the bore 30, on the bottom surface of the clamp plate. The outer portion 44 of the fin plate 22, beyond the annular wall 32, is disposed within the recessed annular area 42. Fittings, or in the preferred embodiment, hose barbs 46, are threaded into a fluid inlet conduit 76 and a fluid outlet conduit 78, each positioned on the turret proximate the top 52 of the turret 20. The outer portion of the fin plate 22 and the hose barbs 46 serve to retain the heat exchanger 24 within the clamp plate 26 and bow spring 28 assembly. The heat exchanger, comprising the fin plate 22 and the turret head 20, is free to rotate within the clamp plate and bow spring.

As shown in FIGS. 5 and 9, the bottom plate, also called the fin plate 22, has an annular wall 32 extending upwardly from the surface of the plate with an outer circumference identical to the circumference of the cylindrical turret head 20. The inside portion 34 of the annular wall is raised to define an annular groove 36. The central portion of the bottom surface of the turret head 38 is substantially planar and has a ridge around the edge 40 to fit within the groove 36. The turret head 20 is mated to fin plate 22 by fitting the raised portion of the annular wall 34 concentrically within the extended edge 40 of the turret head such that the extended edge sets against the groove 36. The bottom surface 38 of the turret head rests on the top of fins in a tight seal so that bottom 38, the annular wall 32, and the fin plate 22 form a circular chamber within the annular wall 32. The fitting is secured and sealed by an appropriate adhesive or coupling technique, such as electron beam welding.

As shown in FIG. 8, in a preferred embodiment, there is at least one array of heat conducting fins on the fin plate, within the annular wall. The array comprises a plurality of fins extending upwardly from the surface of the fin plate. The fins of the array are arranged to form a generally radial pattern extending outward from a central region of the fin plate to a peripheral region. More specifically, in a preferred embodiment, as best illustrated in FIGS. 8, 9, and 10, there are two concentric arrays of fins, an inner array 52 and an outer array 54. Each of the arrays comprises a plurality of heat conducting fins. Each fin of each array extends laterally outward in the direction of the perimeter of the fin plate 22, from a leading edge 58 to a trailing edge 60. The leading edges 58 of the fins in the array are aligned in a circular pattern, with the center of the pattern being the center of the fin plate 22. The trailing edges 60 of the fins in the array are also aligned in a second circular pattern, centered about the center of the fin plate. Furthermore, the fins are aligned and curved such that the trailing edge 60 of each fin is rotationally offset from the leading edge 58 of the fin as measured by a rotational angle about the center of the fin plate. The offset is equal and in the same direction for each fin. The fins are thus arranged such that they define a spiral pattern. Each fin of a given array is also identically configured. In addition, in one embodiment, the leading edges of the first array of fins are tapered.

The outer array of fins 54 surrounds the inner array 52, as shown in FIGS. 8, 9, and 10. The two arrays are separated by a first annular space 62. There is also a second annular space 64 between the trailing edges 60 of the outer array 54 of fins and the inside surface of the annular wall 32. In one embodiment, there are about twice as many fins in the outer array than in the inner array. In alternative embodiments, the ratio is 2.5 to 3 fins in the outer array for each fin in the inner array; alternatively, there are the same number of fins in the outer array as in the inner array.

Figure 6:
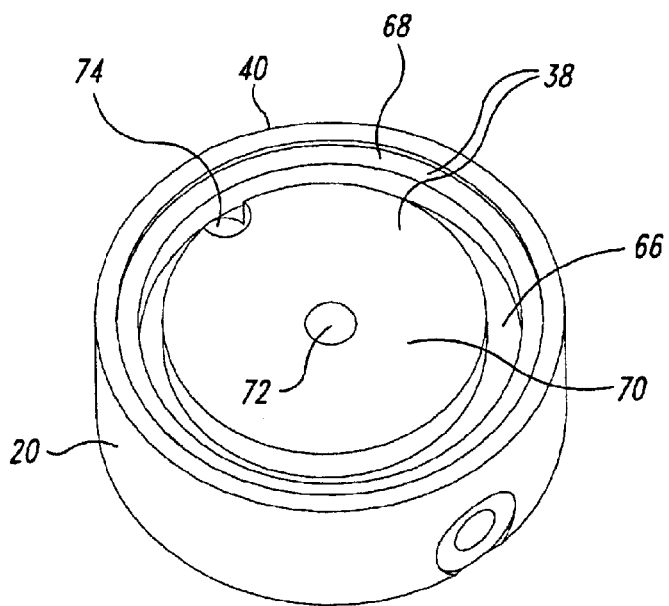
FIG. 6 is an isometric view of the bottom of the cylindrical turret head.
Figure 7:
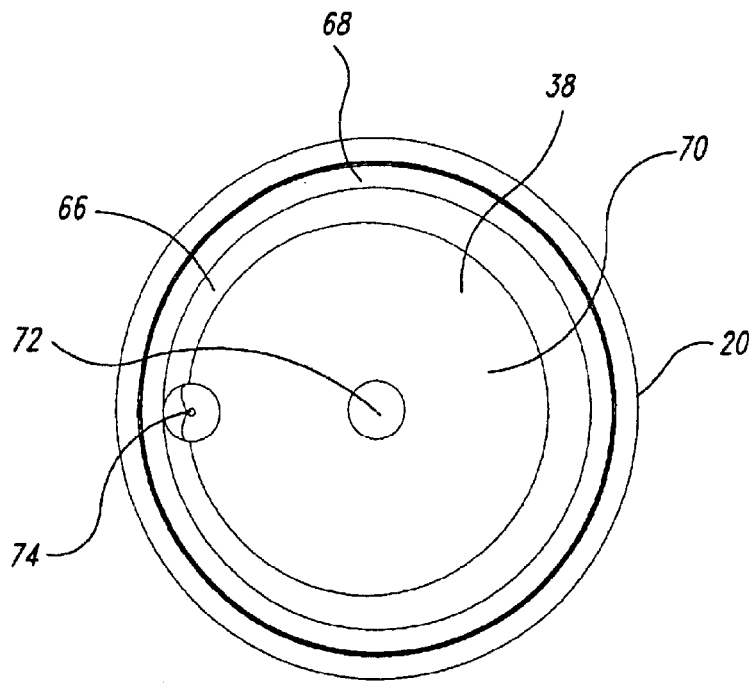
FIG. 7 is a plan view of the bottom of the cylindrical turret head.

As best seen in FIGS. 5, 6, and 7, the cylindrical turret head 20 has a planar and circular bottom surface 38 with an annular channel 66 recessed upwardly into the bottom surface 38 at a peripheral region of the bottom surface. An outer portion 68 of the bottom surface, outside of the annular channel 66, is mated against the raised portion 34 of the annular wall that extends from the fin plate 22. In addition, an inside portion 70 of the planar bottom surface, surrounded by the annular channel 66, is mated against the top edges of the fins 52, 54.

Referring to FIGS. 5,6 and 7, it can be seen that the cylindrical turret head 20 includes a fluid inlet aperture 72 in the bottom surface, centered directly over the center of the fin plate 22, as well as a fluid outlet aperture 74, positioned within the annular fluid channel 66. In one embodiment, the fluid outlet aperture 74 is partly positioned within the annular channel 66 but also encompasses a portion of the bottom surface of the turret head proximate the annular channel, as seen in FIGS. 6 and 7. One embodiment also includes a cylindrical fluid inlet conduit 76 that extends from an opening 48 on the circumferential outside wall of the cylindrical turret head 20, proximate the top of the turret head, inwardly and laterally toward the center of the turret head. The conduit then turns at a right angle, and extends vertically downward, in a direction transverse to the fin plate, toward the fin plate, opening through the fluid inlet aperture 72. There is also a cylindrical fluid outlet conduit 78 beginning at the fluid outlet aperture and extending vertically upward in a direction transverse to the fin plate, to an upper portion of the turret head. Then outlet conduit then turns at a right angle and extends laterally to the circumferential outside wall of the turret head, opening 50 on that wall. In addition, the lateral portions of the inlet and outlet conduits are threaded near the openings 48, 50 on the outside wall of the turret head such that hose barbs 46 can be threadedly engaged to the openings.

The recessed annular fluid channel 66 of the cylindrical turret head 20 is position above the second annular space 64 which extends between the trailing edge 60 of the second array of fins and the inside surface of the annular wall 32. In addition, the recessed annular fluid channel 66 has a varying cross sectional area. The cross sectional is greatest at a location diametrically opposite the outlet aperture 74 and continuously decreases to a minimum adjacent the outlet aperture.

Although the illustrated embodiment has been described, one skilled in the art will understand that the invention may be practiced without several of the details described, and may have alternative embodiments. For example, a variation of the invention that may have also improve fluid distribution includes directing the fluid out from the central region of the chamber in a straight radial direction.

Figure 11:
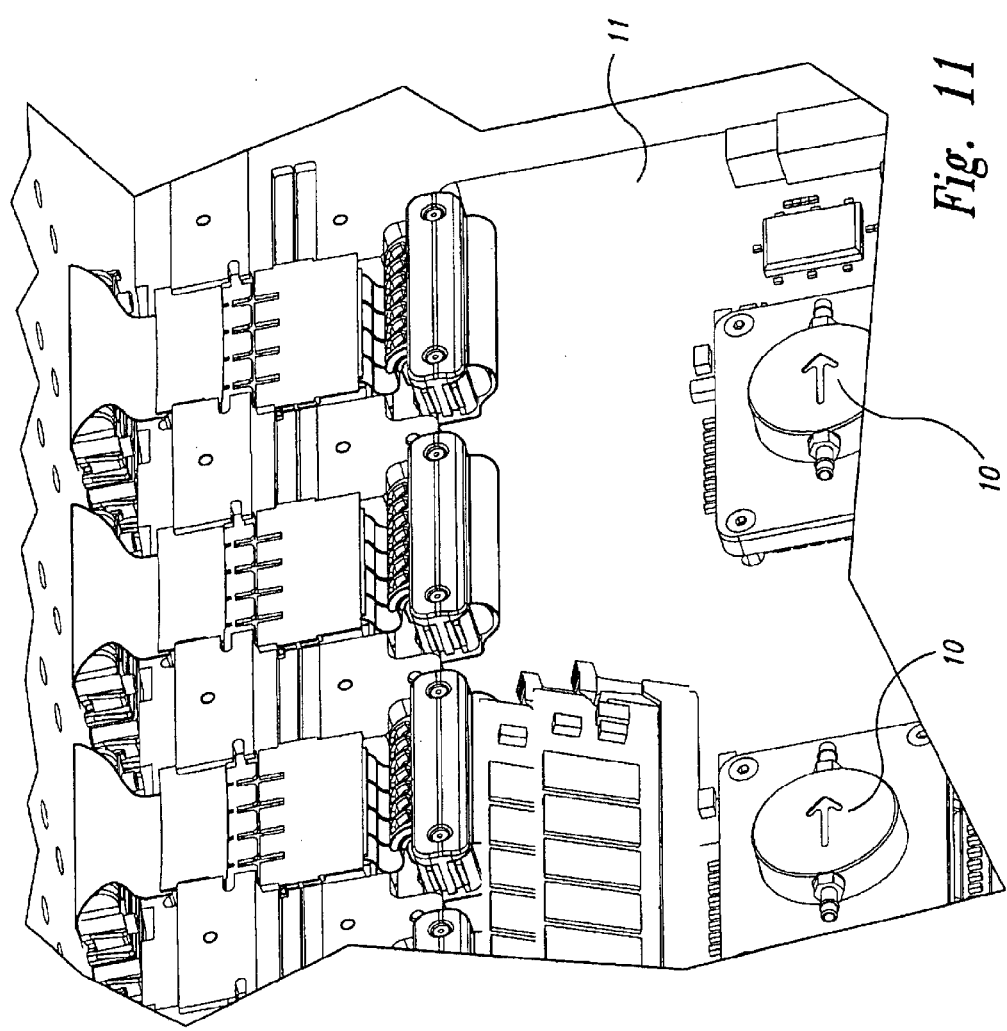
FIG. 11 is a view of the heat exchanger assembly, including the clamp plate and bow spring, disposed on a circuit board.

During operation, the heat exchanger assembly 10 is typically employed to cool a semiconductor chip within a system board 11 as shown in FIG. 11. The semiconductor chip 17 is typically in a package wherein the chip is disposed in a substrate 16, as shown in FIG. 2A. The substrate and the chip are held in a socket 14 with the heat spreading surface 18 placed over the chip. The entire package is then disposed adjacent the heat exchanger such that the bottom surface of the fin plate 22 mates with the heat conducting surface, or heat spreading surface 18, as shown in FIGS. 2A and 4.

As indicated previously, the heat exchanger 24, which includes the cylindrical turret head 20 and the fin plate 22, can be rotated within the heat exchanger assembly 10. This allows a user to selectively position the turret head 20 within the system board 11, so as to run tubing from the hose barbs. An arrow 27 on top of the turret head 20 provides a direction arrow of the fluid flow. Having the arrow 27 on the package itself makes it easy for an installer to see the direction of fluid flow within the computer as installed. Within the tight confines where a system board is disposed, the rotatable exchanger provides for easy access of the tubing to the heat exchanger from any user-selected direction.

Cooling fluid is introduced into the inlet conduit 76 of the exchanger 24 through the tubing and hose barbs, see FIG. 5. The fluid travels laterally through the inlet conduit to the center portion of the cylindrical turret head 20 then turns at a right angle and travels downward through a vertical portion of the inlet conduit. The fluid exits the inlet conduit through the inlet aperture 72, centered over the center of the fin plate 22 as shown in FIG. 6, and impinges on a central region 65 of the fin plate. Once the fluid impinges or impacts on the fluid plate, it makes a sharp bend, 90°, and spreads outward, in a generally radial direction, from the central region 65 toward the annular wall 32 of the fin plate, with substantially even distribution, through the flow channels defined by the fins 52, 54. The fluid direction thus changes dramatically from an average downward velocity after exiting the inlet aperture, to an average lateral velocity transverse to the downward velocity. This sudden change in direction generates highly turbulent flow. The turbulence generated has the advantage of increasing convection as well as lowering the boundary layer thickness of the fluid on the fins 52,54, as well as other walls within the heat exchanger that are in communication with the fluid. These effects all contribute to a higher overall heat transfer coefficient for the heat exchanger 24.

As the fluid passes through the inner array of fins 52, a boundary layer forms on the fins 52 that increases in thickness from the leading edge 58, to the trailing edge 60 of each fin. After the fluid leaves the trailing edge 60 and passes through the first annular space 62 to the out array of fins 54, the boundary layer thickness begins at zero again on the leading edges 58 of the outer array of fins. The first annular space thus provides the advantage of breaking boundary layer formation on the fins so that it has two zero points, one at the leading edges of the inner array 54, and one at the leading edges of the outer array 54. This in turn helps increase the overall heat transfer of the exchanger.

The fins are arranged in a spiral pattern in the preferred embodiment, as discussed previously, and this has at least three major impacts on operation of the heat exchanger. First, the spiral configuration permits the total length of the fins to exceed the radial length of the circle, thus allowing for more heat transfer area on the fins. In addition, the fins have a slight curvature in the preferred embodiment and this reduces boundary layer thickness as the momentum of the fluid is constantly changing with respect to the fins. Also, the fluid develops an angular moment as it reaches the annular wall 32 and this angular momentum carries the fluid into circular flow in the second annular space 64. The fluid fills the annular space 64 as well as the annular channel 66 that rises above the annular space. The velocity of the fluid rotating about the perimeter of the fins in the second annular space, reduces back pressure against the fluid flowing out of the fins 54 into the region of the second annular space 64. This happens by Bernoulli's principle, whereby an increase in momentum of an incompressible fluid is accompanied by a corresponding drop in pressure. The reduced back pressure has the effect of ensuring better distribution, or radial spreading, of the cooling fluid over the fins.

It may be desired, in some embodiments to provide the fin arrays in any convenient pattern, with a slight slope to impart the spiral to the flow as explained herein. In alternative embodiments, it may be desired to select the specific number of fins, together with their angular position in order to assure a uniform flow velocity at all positions within the chamber. As will be appreciated, as the flow extends outward, and the channel between the fins becomes slightly larger, the fluid has a tendency to slow down because of the wider cross-sectional area over which it is traveling. The curvature of the fins can be selected in order to impart the appropriate change in angular velocity to the fluid to approximately equal the decrease in flow based on the expansion of the cross-sectional area between the fins so that the overall velocity of fluid remains approximately the same as it flows from the central region outward. Similarly, the number of fins in the outer array is selected to assure that the velocity of the fluid remains the same, perhaps increases slightly as it approaches the outer periphery. The number of fins selected for the outer array may therefore be determined based on those fins which will provide a uniform cross-sectional area of the channel region for the water to flow so as to maintain a constant flow rate of the fluid towards the outer periphery. Similarly, the angle of the fins may be selected so as to compensate for any loss in speed due to increase in cross-sectional area so that the angular velocity imparted to the fluid counteracts, and equals any decrease which may occur based on the change in cross-sectional area towards the outer edges of the periphery. Thus, in some embodiments, the ratio of fins in the outer area of the array may be significantly higher than the number of fins in the inner array depending on their relative lengths, the position of the arrays within the circle and other conditions so as to achieve a constant fluid velocity at all portions within the chamber. In some embodiments, it may be desired to achieve an increasing flow and fluid velocity towards the outer edges of the chamber. In these embodiments, the available channel area for the fluid flow will slightly decrease towards the outer edges so that the fins in the outer array may be more numerous, or, take up more cross-sectional area of the channel so that the available channel flow for the water flow is slightly decreased, thus increasing the velocity and maintaining a high flow rate with turbulent flow to remove heat from the bottom plate.

The varying cross sectional area of the annular channel 66 is largest at a point furthest from the outlet aperture, and gradually decreases to a minimum adjacent the fluid outlet aperture. This has the effect of equalizing the total pressure drop for a given flow rate initiated in any radial direction. The total pressure drop includes the pressure drop of the fluid from the central region 65, to the second annular space 64, then from the second annular space, to the fluid outlet aperture 74. By equalizing the pressure drop, for a given flow rate in any radial direction, distribution of the fluid is equalized throughout the exchanger. This in turn increases heat transfer efficiency of the heat exchanger.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A heat exchanger assembly, comprising:
   a semiconductor chip;
   a heat conducting plate having a first surface positioned adjacent said semiconductor chip;
   a circular chamber positioned above a second surface of the heat conducting plate, an outer perimeter of the circular chamber being defined by the inside surface of an annular wall;
   a plurality of heat conducting fins disposed within the circular chamber arranged in a spiral pattern, each fin extending from a central area of the chamber out toward a peripheral portion of the chamber;
   a fluid inlet aperture positioned at a central portion of the circular chamber, configured to direct fluid entering the chamber to impinge against the second surface of the plate;
   a fluid outlet aperture positioned at a peripheral region of the circular chamber;
   at least one annular space in the circular chamber proximate the annular wall, between a trailing edge of the fins and the annular wall; and
   an overhead wall of the circular chamber having an annular fluid channel recessed upwardly into the wall and having a varying cross sectional area with the area being greatest at a distance farthest from the fluid outlet aperture and the area being at a minimum adjacent the fluid outlet aperture.

2. The heat exchanger assembly of claim 1 wherein each fin extends laterally from a leading edge to a trailing edge with the trailing edge being closer to the peripheral portion of the circular chamber, and the fin being laterally curved in the direction of the spiral pattern.

3. The heat exchanger assembly of claim 1 wherein the fins are arranged in at least two concentric circular arrays, comprising at least an inner array and at least an outer array, each circular array comprising a plurality of fins arranged in a generally radial pattern with each fin extending from a leading edge of the fin to a trailing edge of the fin, the trailing edge being positioned radially outward of the leading edge closer to a peripheral region of the circular chamber.

4. The heat exchanger assembly of claim 3 wherein the fins of each circular array are arranged in a spiral pattern, each fin have a leading edge and a trailing edge, with the trailing edges of the fins being positioned closer to a peripheral region of the circular chamber than leading edges.

5. The heat exchanger assembly of claim 3 wherein the circular chamber has at least two annular space regions, with at least a first annular space being between the inner array and outer array of fins, and at least a second annular space being between the outer array of fins and an inside surface of an annular wall of the chamber.

6. The heat exchanger assembly according to claim 5 wherein the annular fluid channel is disposed over at least one of the annular space regions in the circular chamber.

7. The heat exchanger of claim 3 wherein the inner array is spaced apart from the outer array, having an annular space therebetween.

8. The heat exchanger assembly of claim 1 wherein an outer portion of the circular chamber has a varying cross sectional area.

9. The heat exchanger assembly of claim 8 wherein the cross section area of the outer portion of the chamber is greatest at a position diametrically opposed to the position of the fluid outlet aperture.

10. The heat exchanger assembly of claim 1 wherein the fluid inlet aperture is positioned in the overhead wall of the circular chamber at the center of the wall and the fluid outlet aperture is positioned in the overhead wall at the periphery of the wall.

11. The heat exchanger of claim 1 wherein each of the plurality of heat conducting fins extends from the second surface of the heat conducting plate to the overhead wall.

12. A heat exchanger for a semiconductor chip comprising:
   a heat conducting surface;
   a circular chamber positioned above the heat conducting surface;
   a fluid inlet aperture in the circular chamber, a fluid outlet aperture in the circular chamber;

a plurality of heat conducting fins disposed within the circular chamber and arranged in at least two concentric circular arrays, comprising at least an inner array and at least an outer array, each circular array comprising a plurality of fins arranged in a generally radial pattern with each fin extending from a leading edge of the fin to a trailing edge of the fin, the trailing edge being positioned radially outward of the leading edge closer to a peripheral region of the circular chamber; and first and second annular space regions, the first annular space being between the inner array and outer array of fins, and the second annular space being between the outer array of fins and an inside surface of an annular wall of the chamber an annular fluid channel recessed upwardly into an overhead wall of the circular chamber and having a varying cross sectional area the cross sectional area being greatest at a distance along the channel furthest from the fluid outlet aperture and at a minimum adjacent the fluid outlet aperture, the annular fluid channel being disposed over at least one of the annular space regions in the circular chamber.

\* \* \* \* \*